(12) United States Patent
Nagel et al.

(10) Patent No.: US 12,075,630 B2
(45) Date of Patent: *Aug. 27, 2024

(54) METHODS OF FORMING MAGNETORESISTIVE DEVICES AND INTEGRATED CIRCUITS

(71) Applicant: Everspin Technologies, Inc., Chandler, AZ (US)

(72) Inventors: Kerry Joseph Nagel, Scottsdale, AZ (US); Sanjeev Aggarwal, Scottsdale, AZ (US); Thomas Andre, Austin, TX (US); Sarin A. Deshpande, San Jose, CA (US)

(73) Assignee: Everspin Technologies, Inc., Chandler, AZ (US)

( * ) Notice: Subject to any disclaimer, the term of this patent is extended or adjusted under 35 U.S.C. 154(b) by 15 days.

This patent is subject to a terminal disclaimer.

(21) Appl. No.: 18/045,539

(22) Filed: Oct. 11, 2022

(65) Prior Publication Data

US 2023/0100514 A1 Mar. 30, 2023

Related U.S. Application Data

(60) Continuation of application No. 17/134,865, filed on Dec. 28, 2020, now Pat. No. 11,482,570, which is a
(Continued)

(51) Int. Cl.
| | |
|---|---|
| *H01L 29/82* | (2006.01) |
| *G11C 11/16* | (2006.01) |
| *H01L 43/00* | (2006.01) |
| *H10B 61/00* | (2023.01) |
| *H10N 50/01* | (2023.01) |
| *H10N 50/10* | (2023.01) |
| *H10N 50/80* | (2023.01) |

(52) U.S. Cl.
CPC ............ *H10B 61/00* (2023.02); *G11C 11/161* (2013.01); *H10N 50/01* (2023.02); *H10N 50/10* (2023.02); *H10N 50/80* (2023.02)

(58) Field of Classification Search
CPC ...... H10B 61/00; G11C 11/161; H10N 50/01; H10N 50/10; H10N 50/80
USPC ....................................................... 257/421
See application file for complete search history.

(56) References Cited

U.S. PATENT DOCUMENTS

| | | |
|---|---|---|
| 8,802,451 B2 | 8/2014 | Malmhall et al. |
| 9,129,690 B2 | 9/2015 | Park et al. |
| (Continued) | | |

*Primary Examiner* — Theresa T Doan
(74) *Attorney, Agent, or Firm* — Bookoff McAndrews, PLLC

(57) ABSTRACT

Magnetoresistive device architectures and methods for manufacturing are presented that facilitate integration of process steps associated with forming such devices into standard process flows used for surrounding logic/circuitry. In some embodiments, the magnetoresistive device structures are designed such that the devices are able to fit within the vertical dimensions of the integrated circuit associated with a single metal layer and a single layer of interlayer dielectric material. Integrating the processing for the magnetoresistive devices can include using the same standard interlayer dielectric material as used in the surrounding circuits on the integrated circuit as well as using standard vias to interconnect to at least one of the electrodes of the magnetoresistive devices.

20 Claims, 7 Drawing Sheets

*FIG. 2*

Related U.S. Application Data continuation of application No. 16/881,958, filed on May 22, 2020, now Pat. No. 11,335,728, which is a continuation of application No. 16/143,088, filed on Sep. 26, 2018, now Pat. No. 10,700,123, which is a continuation of application No. 15/650,203, filed on Jul. 14, 2017, now Pat. No. 10,103,197, which is a division of application No. 15/230,402, filed on Aug. 6, 2016, now Pat. No. 9,711,566, which is a division of application No. 14/872,708, filed on Oct. 1, 2015, now Pat. No. 9,412,786.

(60) Provisional application No. 62/058,996, filed on Oct. 2, 2014.

(56) References Cited

U.S. PATENT DOCUMENTS

| | | |
|---|---|---|
| 9,412,786 B1 | 8/2016 | Andre et al. |
| 9,711,566 B1 | 7/2017 | Andre et al. |
| 10,103,197 B1 | 10/2018 | Andre et al. |
| 10,700,123 B2 | 6/2020 | Andre et al. |
| 11,335,728 B2 | 5/2022 | Nagel et al. |
| 11,482,570 B2 * | 10/2022 | Nagel .................... H10N 50/80 |
| 2003/0180968 A1 | 9/2003 | Nallan et al. |
| 2005/0157544 A1 | 7/2005 | Min et al. |
| 2011/0233696 A1 | 9/2011 | Li |
| 2019/0043921 A1 | 2/2019 | Andre et al. |
| 2020/0286950 A1 | 9/2020 | Nagel et al. |
| 2021/0118948 A1 | 4/2021 | Nagel et al. |

* cited by examiner

METHODS OF FORMING MAGNETORESISTIVE DEVICES AND INTEGRATED CIRCUITS

CROSS REFERENCE TO RELATED APPLICATIONS

This application is a continuation of U.S. patent application Ser. No. 17/134,865, filed Dec. 28, 2020, which is a continuation of U.S. patent application Ser. No. 16/881,958, filed May 22, 2020, now U.S. Pat. No. 11,335,728, issued May 17, 2022, which is a continuation of U.S. patent application Ser. No. 16/143,088, filed Sep. 26, 2018, now U.S. Pat. No. 10,700,123, issued Jun. 30, 2020, which is a continuation of U.S. patent application Ser. No. 15/650,203, filed Jul. 14, 2017, now U.S. Pat. No. 10,103,197, issued Oct. 16, 2018, which is a divisional of U.S. patent application Ser. No. 15/230,402, filed Aug. 6, 2016, now U.S. Pat. No. 9,711,566, issued Jul. 18, 2017, which is a divisional of U.S. patent application Ser. No. 14/872,708, filed Oct. 1, 2015, now U.S. Pat. No. 9,412,786, issued Aug. 9, 2016, which claims the benefit of priority of U.S. Provisional Patent Application No. 62/058,996, filed Oct. 2, 2014. The contents of application Ser. Nos. 17/134,865; 16/881,958; 16/143,088; 15/650,203; 15/230,402; 14/872,708; and 62/058,996 are incorporated by reference herein in their entireties.

TECHNICAL FIELD

The disclosure herein relates generally to magnetoresistive devices and more particularly to the integration of such devices on integrated circuits with other circuits.

BACKGROUND

Magnetoresistive devices such as magnetic sensors and magnetic memory cells include magnetic materials where the magnetic moments of those materials can be varied to provide sensing information or store data. For example, in certain magnetic memory devices, the voltage drop across a magnetic tunnel junction (MTJ) can be varied based on the relative magnetic states of the magnetoresistive layers within the memory cell. In such memory devices, there is typically a portion of the memory cell that has a fixed magnetic state and another portion that has a free magnetic state that is controlled to be either parallel or antiparallel to the fixed magnetic state. Because the resistance through the memory cell changes based on whether the free portion is parallel or antiparallel to the fixed portion, information can be stored by setting the orientation of the free portion. The information is later retrieved by sensing the orientation of the free portion. Such magnetic memory devices are well known in the art.

Manufacturing magnetoresistive devices, including MTJ devices, includes a sequence of processing steps during which many layers of materials are deposited and then patterned to form a magnetoresistive stack and the electrodes used to provide electrical connections to the magnetoresistive stack. The magnetoresistive stack includes the various layers that make up the free and fixed portions of the device as well as one or more dielectric layers that provide at least one the tunnel junction for the device. In many instances, the layers of material are very thin, on the order of a few or tens of angstroms.

In some applications, magnetoresistive devices are included on the same integrated circuit with additional surrounding circuitry. For example, magnetoresistive sensors may be included on an integrated circuit with a microcontroller or other processing circuitry that utilizes the information collected by the sensors. In another example, magnetic random access memory (MRAM) is included on an integrated circuit with a processor or some other logic circuitry. The process flows associated with forming magnetoresistive devices are typically unique with respect to those process steps used to form the surrounding circuitry on such integrated circuits. Therefore, it is desirable to provide magnetoresistive devices and techniques for manufacturing integrated circuits that include magnetoresistive devices that allow for efficient integration with respect to established integrated circuit manufacturing process flows.

DETAILED DESCRIPTION

Figure 1:
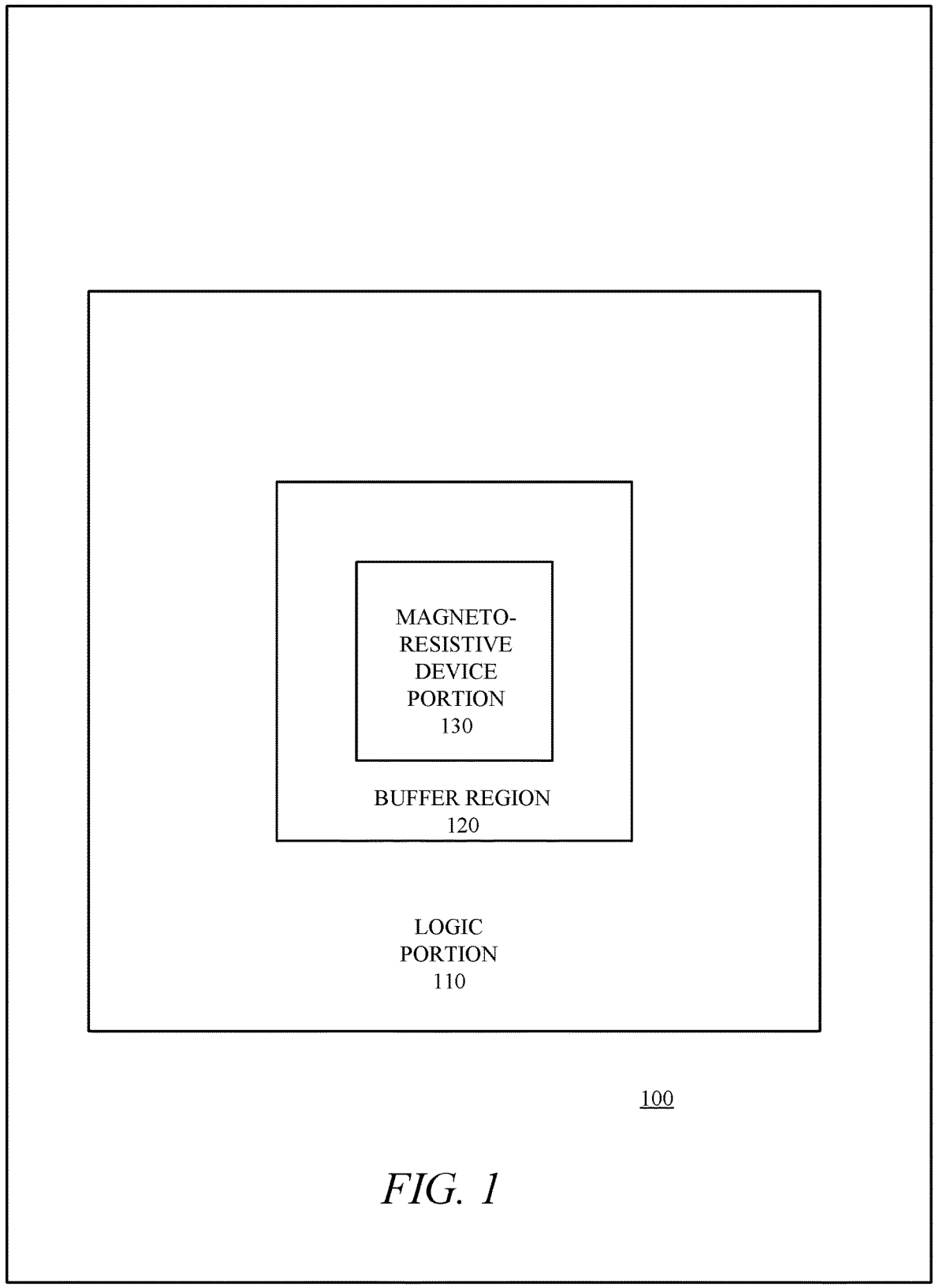
FIG. 1 illustrates a block diagram integrated circuit device that includes magnetoresistive devices in accordance with an exemplary embodiment.

The following detailed description is merely illustrative in nature and is not intended to limit the embodiments of the subject matter or the application and uses of such embodiments. Any implementation described herein as exemplary is not necessarily to be construed as preferred or advantageous over other implementations.

For simplicity and clarity of illustration, the figures depict the general structure and/or manner of construction of the various embodiments. Descriptions and details of well-known features and techniques may be omitted to avoid unnecessarily obscuring other features. Elements in the figures are not necessarily drawn to scale: the dimensions of some features may be exaggerated relative to other elements to improve understanding of the example embodiments. For example, one of ordinary skill in the art appreciates that the cross-sectional views are not drawn to scale and should not be viewed as representing proportional relationships between different layers. The cross-sectional views are provided to help illustrate overall magnetoresistive device structure and processing steps performed in manufacturing such devices. Such cross-sectional views simplify the various layers to show their relative positioning. Moreover, while certain layers and features are illustrated with straight 90-degree edges, in actuality or practice such layers may be more "rounded" or gradually sloping.

The terms "comprise," "include," "have" and any variations thereof are used synonymously to denote non-exclusive inclusion. The term "exemplary" is used in the sense of "example," rather than "ideal."

During the course of this description, like numbers may be used to identify like elements according to the different figures that illustrate the various exemplary embodiments.

For the sake of brevity, conventional techniques related to semiconductor processing may not be described in detail herein. The exemplary embodiments described herein may be fabricated using known lithographic processes as follows. The fabrication of integrated circuits, microelectronic devices, micro electro mechanical devices, microfluidic devices, and photonic devices involves the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photoresist is applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or that not exposed to the radiation, is removed by the application of a developer. An etch may then be applied to the underlying layer not protected by the remaining resist such that the layer overlying the substrate is patterned. Alternatively, an additive process can be used in which a structure is built up using the photoresist as a template.

There are many inventions described and illustrated herein, as well as many aspects and embodiments of those inventions. In one aspect, the described embodiments relate to, among other things, methods of manufacturing integrated circuits that include magnetoresistive devices having electrically conductive electrodes on either side of a magnetic material stack. While not described in detail herein, the magnetic material stack may include many different layers of material, where some of the layers include magnetic materials, whereas others do not. In some embodiments, the methods of manufacturing include forming the layers for the magnetoresistive devices and then masking and etching those layers to produce a magnetic tunnel junction (MTJ) device. Examples of MTJ devices include transducers such as electromagnetic sensors as well as memory cells.

Magnetoresistive devices such as magnetic sensors and magnetic memory cells can be included on an integrated circuit with other circuitry. It is desirable to align with the process steps and structures associated with magnetoresistive devices with the process steps and circuit features associated with the surrounding circuitry. In other words, integrating the manufacture of the magnetoresistive devices into the standard process flow used to manufacture the integrated circuits can be done in a manner that minimizes the number of additional processing steps and materials needed during production. For example, while some process steps and materials associated with building magnetoresistive devices are specific to such devices, other process steps and materials used in manufacturing magnetoresistive devices are also used in manufacturing the surrounding circuitry. As a specific example, conductive layers that are deposited and patterned to form the top and bottom electrodes for magnetoresistive devices can also be used to form connective traces and interlayer connections in standard CMOS process flows.

Structures and techniques are presented herein that are directed at optimizing the integration of the magnetoresistive device processing steps with standard process flows for surrounding logic. Various embodiments are disclosed that reduce the total number of processing steps needed to manufacture such integrated circuits. For example, embodiments are presented in which standard vias associated with logic circuitry on the integrated circuit are also used to provide connections to the magnetoresistive devices, thereby eliminating the need for the additional processing steps that might be required for magnetoresistive-device-specific vias. Embodiments are also disclosed in which the interlayer dielectric used in the portion of the integrated circuit that includes magnetoresistive devices is the same standard-process-flow interlayer dielectric used in the remained of the integrated circuit. Such reuse eliminates the need for additional magnetoresistive-device-specific processing and materials.

FIG. 1 illustrates an integrated circuit device 100 that includes a logic portion 110 and a magnetoresistive device portion 130. While described as including logic circuits, logic portion 110 may include other circuitry typically manufactured using standard process flows. The magnetoresistive device portion 130 includes a plurality of magnetoresistive devices such as, for example, magnetic memory devices or magnetic sensors. The logic portion 110 includes logic circuit elements that are inter-coupled using a plurality of metal layers. As discussed in additional detail below, specific embodiments are presented that include at least three layers of metal, often referred to as M1, M2, and M3. Other embodiments may include four or more layers of metal. In order to provide inter-coupling between these metal layers and circuit elements, vias are formed within the interlayer dielectric separating the metal layers. Vias are holes in the interlayer dielectric in which conductive material is deposited in order to provide an electrical path between the two metal layers on either side of the interlayer dielectric.

The integrated circuit 100 is also shown to include a buffer region 120. The buffer region 120 may include dummy magnetoresistive devices that are not intended for active operation, but may be used to facilitate certain process steps. For example, chemical mechanical polishing (CMP) of the integrated circuit 100 can result in "dishing" where an uneven surface results due to the abrupt change from a high density of magnetoresistive devices in the magnetoresistive device portion 130 to a lack of such devices in the logic portion 110. In one example embodiment, the buffer region 120 includes additional memory storage elements not used to store data. Those additional memory storage elements are patterned or tiled to maintain a desired density of memory storage elements for a certain distance beyond the memory storage elements within the magnetoresistive device portion 130 that are used to store data. Such dummy magnetoresistive devices are typically formed of the same materials used to form the magnetoresistive devices, where the dummy devices are included in the buffer region 120 to provide proper separation between the magnetoresistive devices and the logic portion 110.

In other embodiments, rather than including dummy magnetoresistive devices, unique structures composed of the same materials used to manufacture the magnetoresistive devices can be included in the buffer region 120 where the unique structures are specifically designed to facilitate certain process steps. For example, materials used in manufacturing the magnetoresistive devices can be deposited in specific patterns within the buffer region 120 in order to facilitate chemical mechanical polishing such that an even, flat surface results from such polishing. Such a flat surface helps promote subsequent deposition and patterning steps associated with layers overlying the magnetoresistive devices.

In some embodiments, metal included in the magnetoresistive device portion may be patterned such that areas containing metal geometries exist in a regular pattern relative to the memory storage elements. For example, metal traces may be included every 32 columns or every 256 rows. In the various embodiments discussed above and below, arrays of magnetoresistive devices are formed on the integrated circuit device with routing or other structures that use the second layer of metal interspersed between the arrays or portions of the arrays. When metal is patterned in close proximity to the magnetoresistive devices, the metal may provide a certain density of metal feature geometries where it may be desirable to maintain or gradually reduce the density of such geometries in order to promote uniform processing (e.g. during a CMP) of those areas.

Figure 2:
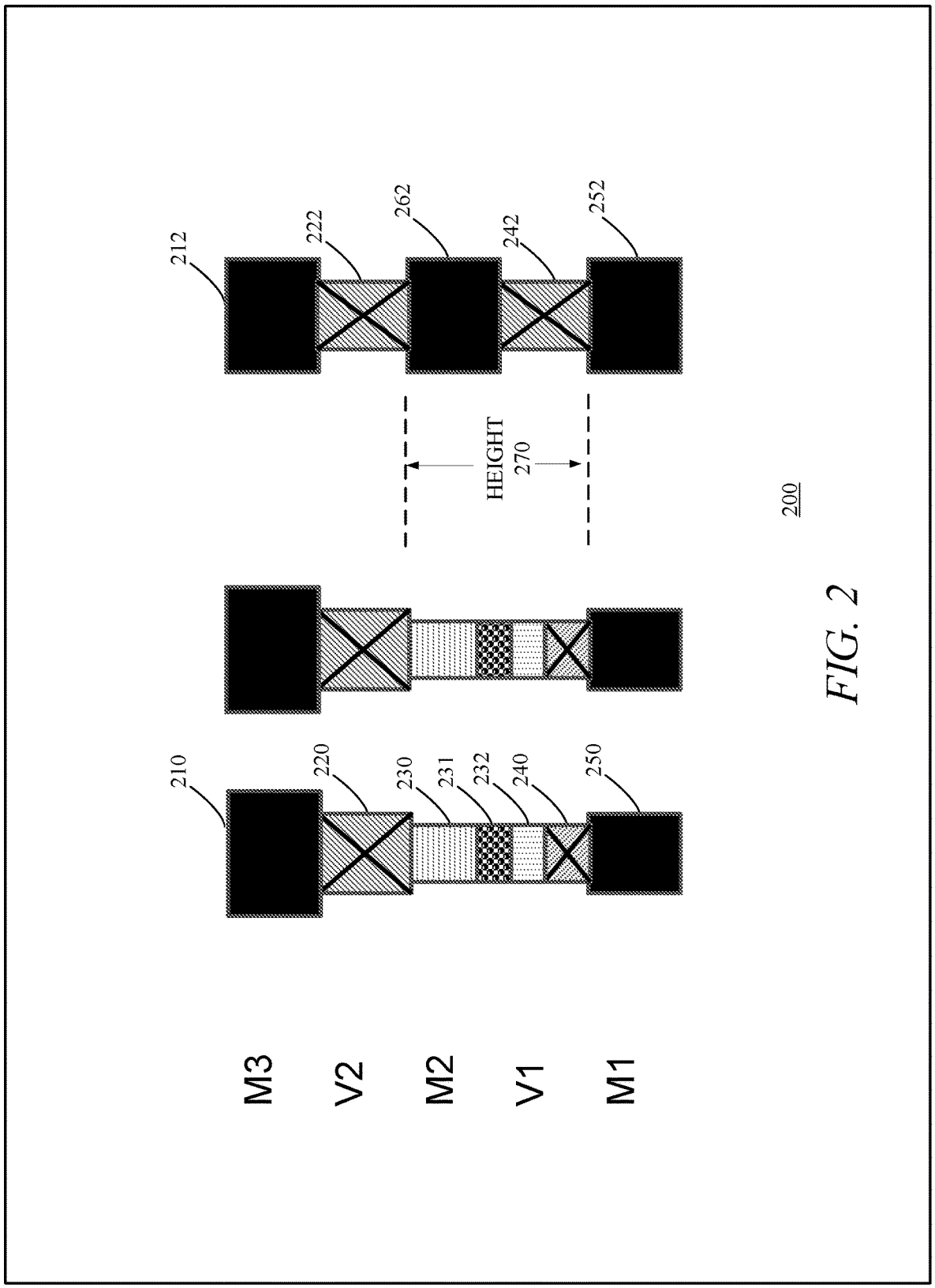
FIGS. 2-6 illustrate cross-sectional views of layers included in magnetoresistive devices and surrounding circuitry in integrated circuits in accordance with exemplary embodiments.

Turning to FIG. 2, a cross-sectional view of a portion of an integrated circuit 200 is presented to help illustrate certain concepts disclosed herein. The labels M1, V1, M2, V2, and M3 on the left-hand side represent certain vertical regions of the integrated circuit. With respect to the standard process flow corresponding to the logic portion of the integrated circuit, M1 corresponds to the vertical space associated with the first metal layer, M2 corresponds to the vertical space associated with the second metal layer, and M3 corresponds to the vertical space associated with the third metal layer. V1 corresponds to vertical space associated with the first interlayer dielectric between M1 and M2. The vias formed in this first interlayer dielectric may be referred to as first-level vias. V2 corresponds to the vertical space associated with the second interlayer dielectric between M2 and M3, and vias formed in the second interlayer dielectric may be referred to as second-level vias.

The right-most column-like vertical structure, which is presented to illustrate the layers in a portion of the logic circuitry included on the integrated circuit, a feature 252 (e.g. trace or other connection point) in the first metal layer is electrically connected to a feature 262 in the second metal layer using a first-level via 242. Similarly, a feature 212 in the third metal layer is electrically connected to feature 262 in the second metal layer using a second-level via 222.

The left two column-like structures in FIG. 2 represent magnetoresistive devices and associated connection circuitry that may be included on the same integrated circuit 200. The first magnetoresistive device includes a magnetoresistive stack 231, which, as described above, typically includes a plurality of layers that form one or more tunnel junctions. For example, a dielectric layer is sandwiched between a free layer and a fixed layer to form a magnetic tunnel junction. While the specifics of the magnetoresistive stack 231 are not described in detail herein, many different magnetoresistive stack implementations are known in the art, and it is contemplated that any of such magnetoresistive stack implementations now known, or later developed, can be used in conjunction with the teachings presented herein.

The magnetoresistive device also includes a top electrode 230 and a bottom electrode 232, where such electrodes are formed of conductive material that enables the magnetoresistive stack to be accessed by surrounding circuitry. A first via 240, which may be referred to as an Mvia, couples the bottom electrode 232 to a landing pad or trace 250 in the first metal layer M1. Similarly, a second via 220 couples the top electrode 230 of the magnetoresistive device to the third metal layer M3. As shown, the entire magnetoresistive device is disposed between the first layer of metal and the third layer of metal, thereby allowing processing steps corresponding to layers below the first metal layer M1 and above the third metal layer M3 to be performed uniformly for the entire integrated circuit. Essentially, all of the processing for the magnetoresistive portion of the integrated circuit is compartmentalized into a portion of the total processing, where, before such processing begins and after such processing is complete, the standard process flow can be used. Additionally, some of the standard process steps and materials can be used in the compartmentalized portion of the processing used for the magnetoresistive portion, thereby reducing any additional burden associated with the inclusion of magnetoresistive devices on the integrated circuit.

In the embodiment shown in FIG. 2, the magnetoresistive device height (i.e. the total vertical dimension of the layers included in the magnetoresistive device) is shown to be less than a combined height resulting from adding the height of the second metal layer M2 to the height of the first interlayer dielectric layer within which the via 242 is formed. The sum of the height of the first interlayer dielectric layer and the second metal layer M2 is shown in FIG. 2 as height 270. In one example embodiment, the height 270 is on the order of 180 nm. As can be seen, the total height of the top electrode 230, the magnetoresistive stack 231, and the bottom electrode 232 is less than the height 270. The Mvia 240 provides additional height so that the magnetoresistive device height plus the Mvia height equals the height 270. In one example corresponding to a height 270 of 180 nm, the stack is about 21 nm in height, the bottom electrode is about 25 nm, and the top electrode (post-polishing) is about 60 nm, and the Mvia is about 74 nm. This allows the magnetoresistive device to be included on the integrated circuit 200 in a way that minimizes the impact on the standard process flow used to form the other surrounding circuitry on the integrated circuit. All of the layers associated with the magnetoresistive device are included in the vertical portion of the integrated circuit corresponding to the second layer of metal and one layer of interlayer dielectric. As such, the spacing between the first layer of metal and the second interlayer dielectric layer can be kept constant throughout the entire integrated circuit device. Similarly, the thickness of the second interlayer dielectric layer in which second-level via 222 is formed can be kept constant across the integrated circuit device 200. When the second interlayer dielectric is kept constant, the total spacing between the first and third layers of metal is constant as well.

In the embodiment shown in FIG. 2, the magnetoresistive devices are coupled to the third layer of metal M3 using the same second-level via structures used in the logic portion of the integrated circuit 200. Thus, the via 220, which may be referred to as a TJ-via, provides a connection between the top electrode 230 of the magnetoresistive device and the third layer of metal M3 at node 210. The via 220 and the via 222 may be formed using a common set of processing steps. Using standard vias in the magnetoresistive device portion of the integrated circuit to provide electrical conductivity to the top electrodes of the magnetoresistive devices is advantageous as there is no need to make a magnetoresistive-device specific via to connect the magnetoresistive devices to the third metal layer M3. This reduces processing steps and simplifies device manufacturing.

In other embodiments, the vias used within the magnetoresistive device portion of the integrated circuit may differ in some ways from those used in the logic portion. In such embodiments, the two different types of vias may share some structural aspects or material composition. For example, the vias within the magnetoresistive device portion may differ in dimensions with respect to those in the logic portion, yet both types of vias are manufactured using the same materials and process steps. In other embodiments, the vias in the two portions may differ in certain processing steps, while still including common aspects that can be manufactured using the same materials and process steps. Thus, the via 220 and the via 222 are preferably formed in a manner where at least some processing steps used in manufacturing are applied to the formation of each. By reusing process steps already included in the standard process in portions of the magnetoresistive device processing, the total number of steps needed to make the integrated circuit device can be reduced, thereby increasing overall manufacturing efficiency.

In addition to using the same via structure in the magnetoresistive device portion and the logic portion, the same interlayer dielectric material can be used in those two portions of the integrated circuit. In some magnetoresistive device manufacturing, specialty dielectrics such as TEOS are used in order to facilitate proper formation and function of the magnetoresistive devices. For example, after the layers corresponding to the magnetoresistive device have been deposited and etched to form the magnetoresistive device, the spaces between those devices are often filled with TEOS. In the present disclosure, the same standard low-dielectric constant (low-k) dielectric material corresponding to a standard logic process can be deposited in the logic portion of the integrated circuit device as well as the magnetoresistive device portion. Examples of such low-k dielectric materials include porous silicon dioxide, fluorinated silicon dioxide, carbon-doped silicon dioxide, and various combinations of these materials. Thus, the second-level vias that couple the top electrodes of the magnetoresistive devices to the third layer of metal (e.g. via 220) are formed within a layer of interlayer dielectric material identical to that within which the via 222 is formed. Similarly, the same interlayer dielectric can be deposited after formation of the magnetoresistive devices where that interlayer dielectric material separates the magnetoresistive devices included on the integrated circuit. By using the standard-process low-k dielectric instead of TEOS, processing is simplified as the overall set of process steps more closely approaches the set of steps associated with an integrated circuit that does not include magnetoresistive devices.

As can be seen in FIG. 2, the Mvia 240 that couples the bottom electrode 232 to the first metal layer M1 is shorter in height than the first-level vias included in the logic portion (e.g. via 242). In controlling the total height associated with each magnetoresistive device, the top electrode 230, bottom electrode 232, and vias 220 and 240 are the layers having the most flexibility in terms of height variation. For example, while the magnetic stack 231 may be restricted in terms of adjustability from a height perspective because the thickness of those layers greatly impacts the magnetoresistive device characteristics, the height of the top and bottom electrodes 230, 232 is more flexible and can be varied in order to ensure that the total height of the magnetoresistive device aligns with the vertical space within which the magnetoresistive device is to be placed. For example, in some embodiments, the height of the bottom electrode 232 is selected to be between 100 and 500 Å. Similarly, the top electrode 230, which may typically be on the order of 800 Å, can be adjusted in height in order to fit the magnetoresistive device into the space required. In embodiments where the TJvia 220 is not the same via structures as second-level via 222, the TJvia 220 height can be selected to be between 40 and 1,000 angstroms. The Mvia 240 height can also be selected to be between 40 and 1,000 angstroms. Thus, many of the layers associated with the magnetoresistive device have flexibility in terms of their height, thereby enabling those heights to be manipulated in order to meet the requirements to align with the standard logic process.

Notably, it may be desirable to maintain a relatively thin top electrode 230 and bottom electrode 232 for the magnetoresistive devices. Because the bottom electrode 232 is typically etched after the layers corresponding to the magnetoresistive stack 231 have been etched, the residual matter associated with etching the bottom electrode can have adverse impacts on the magnetoresistive stack 231. As such, reducing the height of the bottom electrode 232 reduces the amount of etching required for that layer, thereby reducing the residual material that may adversely impact the magnetoresistive stack. Thus, it may be desirable to include any needed extra height in one of the via structures associated with the magnetoresistive device instead of expanding the height of the top or bottom electrode.

As shown in FIG. 2, the top electrode 230, magnetoresistive stack 231, and bottom electrode 232 are positioned directly over the corresponding Mvia 240. This, which may be referred to as a "coaxial design," limits the total footprint of the magnetoresistive device on the integrated circuit and allows the magnetoresistive devices to be placed in close proximity to each other. In many integrated circuits, the magnetoresistive devices are arranged in an array that includes rows and columns of devices, and the minimal footprint allows for increased memory densities.

Figure 3:
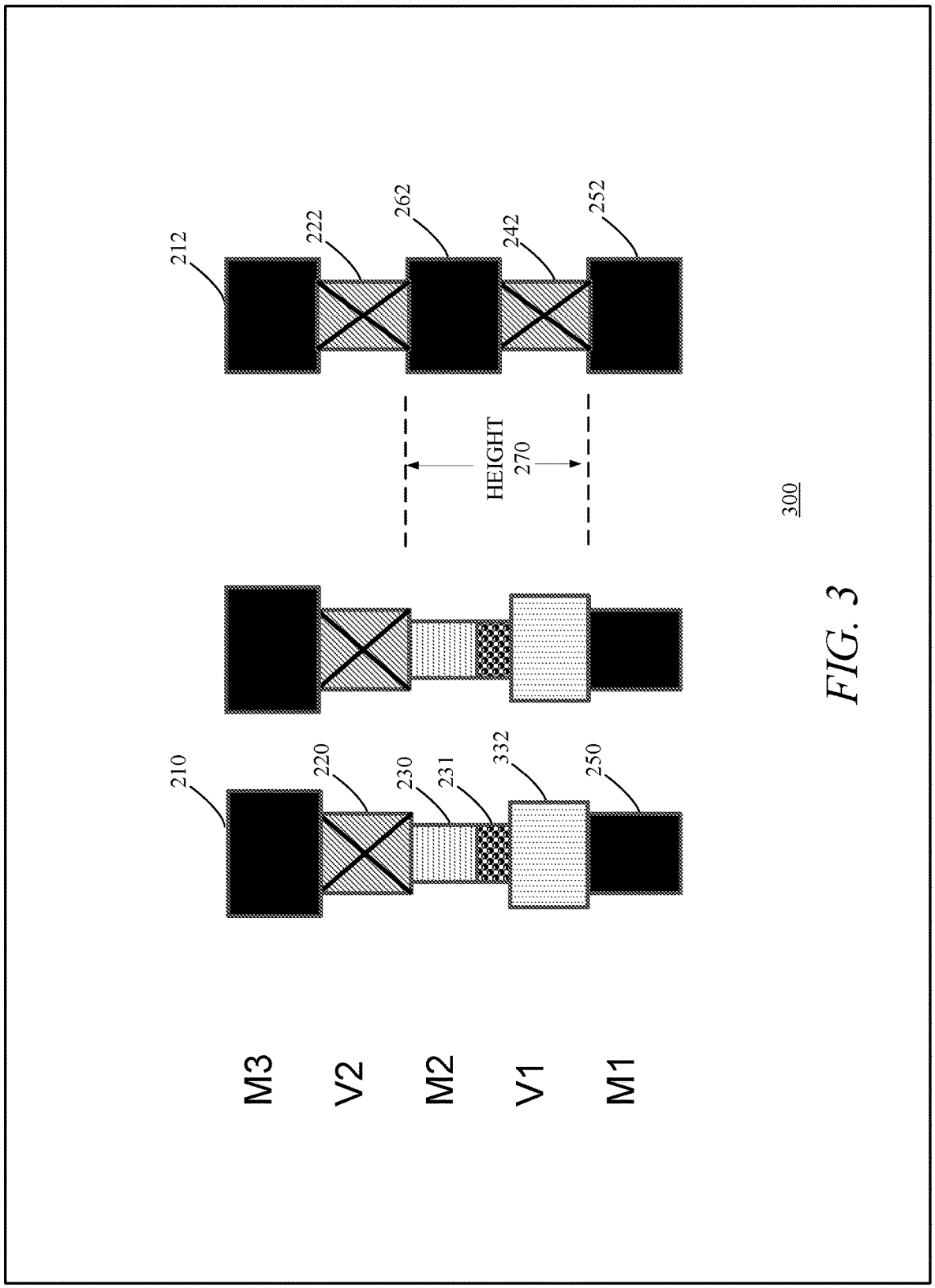

FIG. 3 illustrates an alternate embodiment in which the Mvia underlying the magnetoresistive device is eliminated, and the bottom electrode 332 is expanded to fill the vertical space needed to align the total magnetoresistive device height with the height 270 corresponding to the metal layer 262 and interlayer dielectric layer in which the first-level via 242 is formed. Thus, in the embodiment shown in FIG. 3, the total height of the magnetoresistive device, which includes the top electrode 230, the magnetoresistive stack 231, and the bottom electrode 332 is equal to the height 270. Notably, as used in this description and in the claims that follow, the term "equal" should be understood to in a general sense such that tolerances or slight deviations from equivalency are encompassed. For example, two via structures formed to have "equal" dimensions and the same material composition may vary slightly after completion based on inconsistencies in processing operations.

As shown in FIG. 3, the bottom electrode 332 is also wider than the underlying portion 250 of the first metal layer M1 in order to avoid degradation of the metal underlying bottom electrode. Because the etching materials used to form the bottom electrode are typically very corrosive with respect to copper or other materials that may be used for the first metal layer M1, having a bottom electrode that covers the underlying copper prevents the covered area from being adversely affected by the etchants during formation of the bottom electrode. Thus, in some embodiments the bottom electrode of each magnetoresistive device has a footprint that is greater than a footprint of the corresponding portion of the first metal layer on which the bottom electrode is positioned.

In some embodiments, the second metal layer M2 is not used for interconnections within the portion of the integrated circuit that includes the magnetoresistive devices. Thus, while the second level of metal M2 may be used for routing in the logic portion of the integrated circuit, M2 is not used for any such routing within the magnetoresistive device portion. In other embodiments, routing traces in the second metal layer M2 may be included in the magnetoresistive device portion. In some embodiments those routing traces are used for interconnections within the magnetoresistive device portion, whereas in other embodiments, the routing traces may be used to maintain a pattern of usage of the second metal layer M2 in order to help with structural uniformity/consistency. For example, such second metal routing within the magnetoresistive device portion, while not being used to interconnect nodes electrically, can provide structural support to ensure polishing operations result in a generally flat surface.

Figure 4:
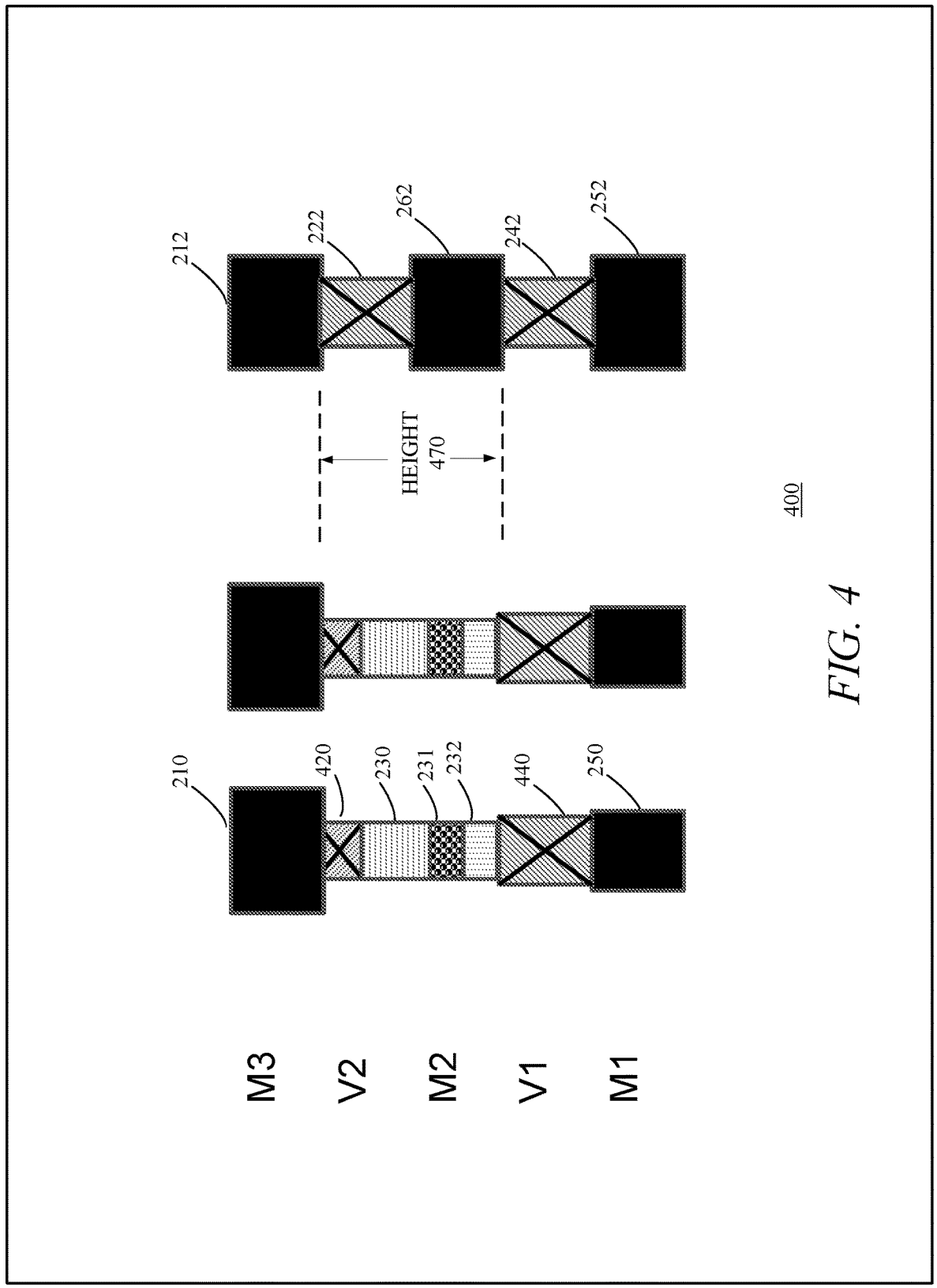
Figure 5:
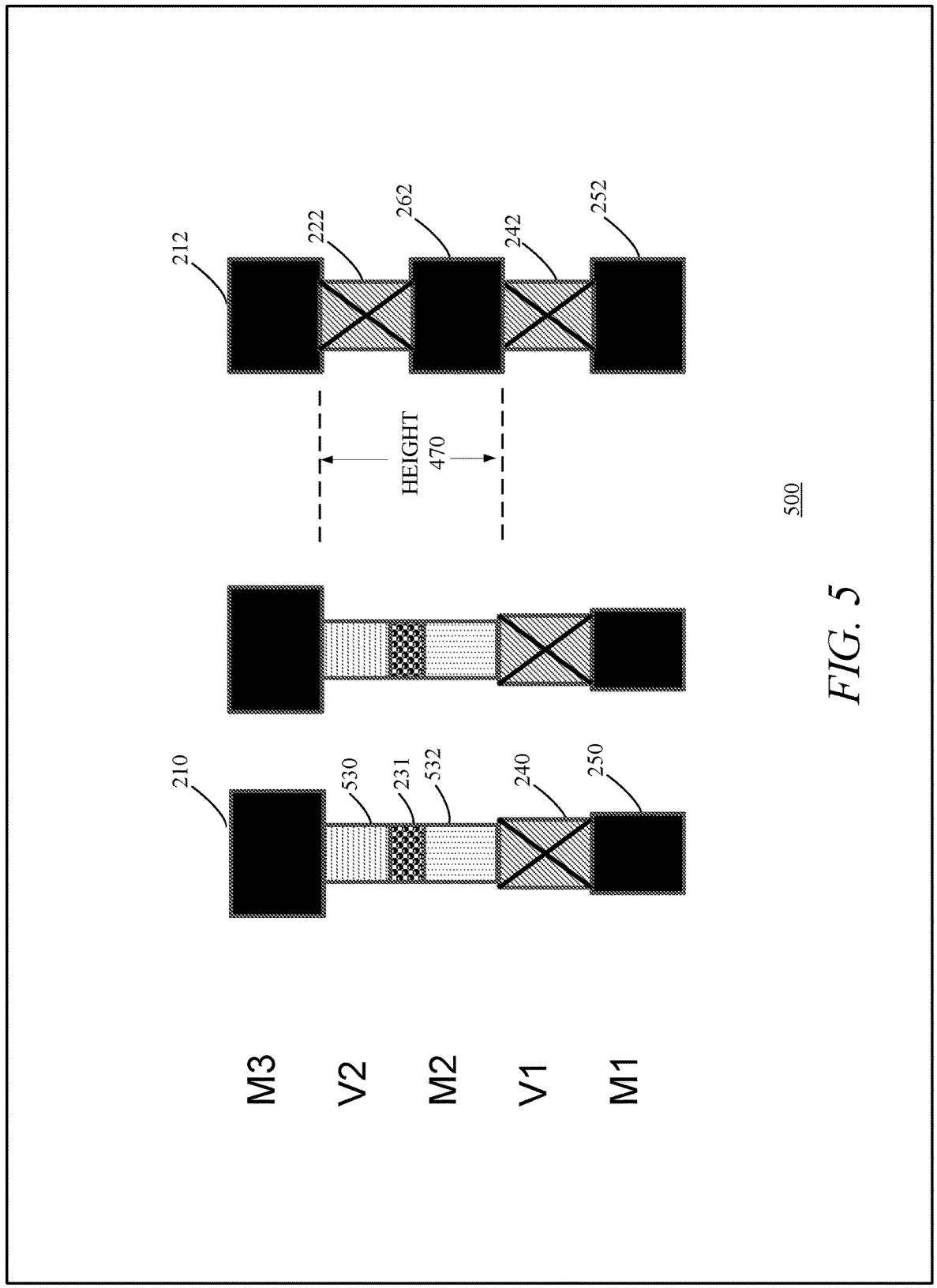

While FIGS. 2 and 3 illustrate embodiments in which the height of the magnetoresistive device is less than or equal to the height 270 corresponding to the second metal layer M2 and the first interlayer dielectric layer, FIGS. 4 and 5 illustrate embodiments in which the magnetoresistive device height is less than or equal to the height 470 corresponding to the second metal layer M2 and the second interlayer dielectric layer. Notably, while the embodiments illustrated in FIGS. 2-5 show the magnetoresistive devices formed at the vertical level on the integrated circuit corresponding to the second metal layer M2, it should be understood that in process flows that include many different metal layers, the magnetoresistive devices can be inserted at varying vertical locations within the integrated circuit device structure. For example, if four metal layers are present, the magnetoresistive device structures may exist at a vertical level corresponding to the third metal layer M3, or the second metal layer M2.

In FIG. 4, the Mvia 440 associated with the magnetoresistive device may have the same composition as the first-level via 242 used within the logic portion of the integrated circuit device. Thus, the Mvia 440 and the first-level via 242 are formed using a common set of a processing steps. As shown in FIG. 4, the TJvia 420 for the magnetoresistive device is shorter in height then the first-level via 222 used in the logic portion of the magnetoresistive device to connect the second layer of metal 262 with the third layer of metal 212. The total height of the magnetoresistive device, which includes the top electrode 230, the magnetoresistive stack 231, and the bottom electrode 232, is less than the height 470 that corresponds to the second layer of magnetic material 262 and the height of the second-level via 222 that is included in the second interlayer dielectric layer. Thus, while a nonstandard via 420 is needed to couple the top electrode 232 the third layer of metal 210, the standard-process via 440 is used to couple the bottom electrode 232 to the first layer of metal 250. As such, a portion of the process flow associated with the logic portion of the integrated circuit is reused as a part of the magnetoresistive device portion formation. Notably, some process steps used to produce the second-level via 222 may be used in the formation of the TJvia 420, thereby further increasing the integration of the magnetoresistive device processing into the standard process flow.

Turning to the embodiment illustrated in FIG. 5, the TJvia 420 of FIG. 4 has been eliminated. In the embodiment illustrated in FIG. 5, the third layer of metal 210 is directly connected to the top electrode 530 of the magnetoresistive device. While not shown, the footprint of the top electrode 530 may be resized or otherwise adapted to facilitate the direct connection the third metal layer 210. In the embodiment illustrated in FIG. 5, the height of the magnetoresistive device, which includes the top electrode 530, the magnetoresistive stack 231, and the bottom electrode 532, is equal to the height 470 the layer of metal 262 and the via 222 in the second layer dielectric layer. The Mvia 240 is preferably formed using the same process steps as the first-level via 242. The top electrode 530 and bottom electrode 532 provide portions of the magnetoresistive device that can have varying heights in order to allow the total height of the magnetoresistive device to be adjusted to align with the height 470.

Figure 6:
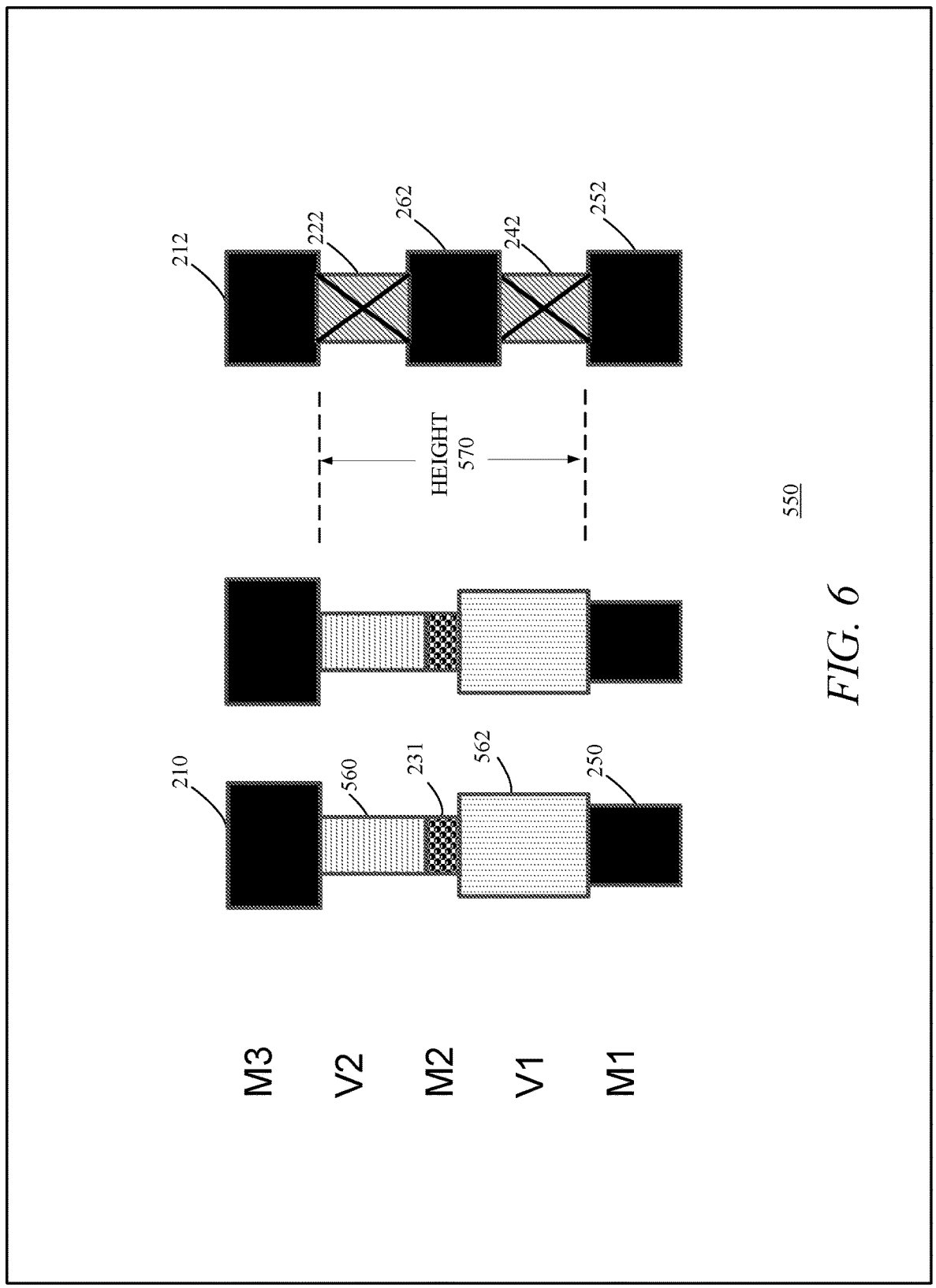

FIG. 6 illustrates an embodiment in which both the TJvia and the Mvia are omitted from the magnetoresistive device interconnect. In the embodiment illustrated, the top electrode 560 for the device couples directly to the third layer of metal M3 210, and the bottom electrode 562 for the device couples directly to the first layer of metal M1 250. In such an embodiment, the total height of the magnetoresistive device is equal to the sum of the heights of the first interlayer dielectric layer, the second layer of metal M2, and the second interlayer dielectric material layer, which is shown in FIG. 6 as height 570.

Figure 7:
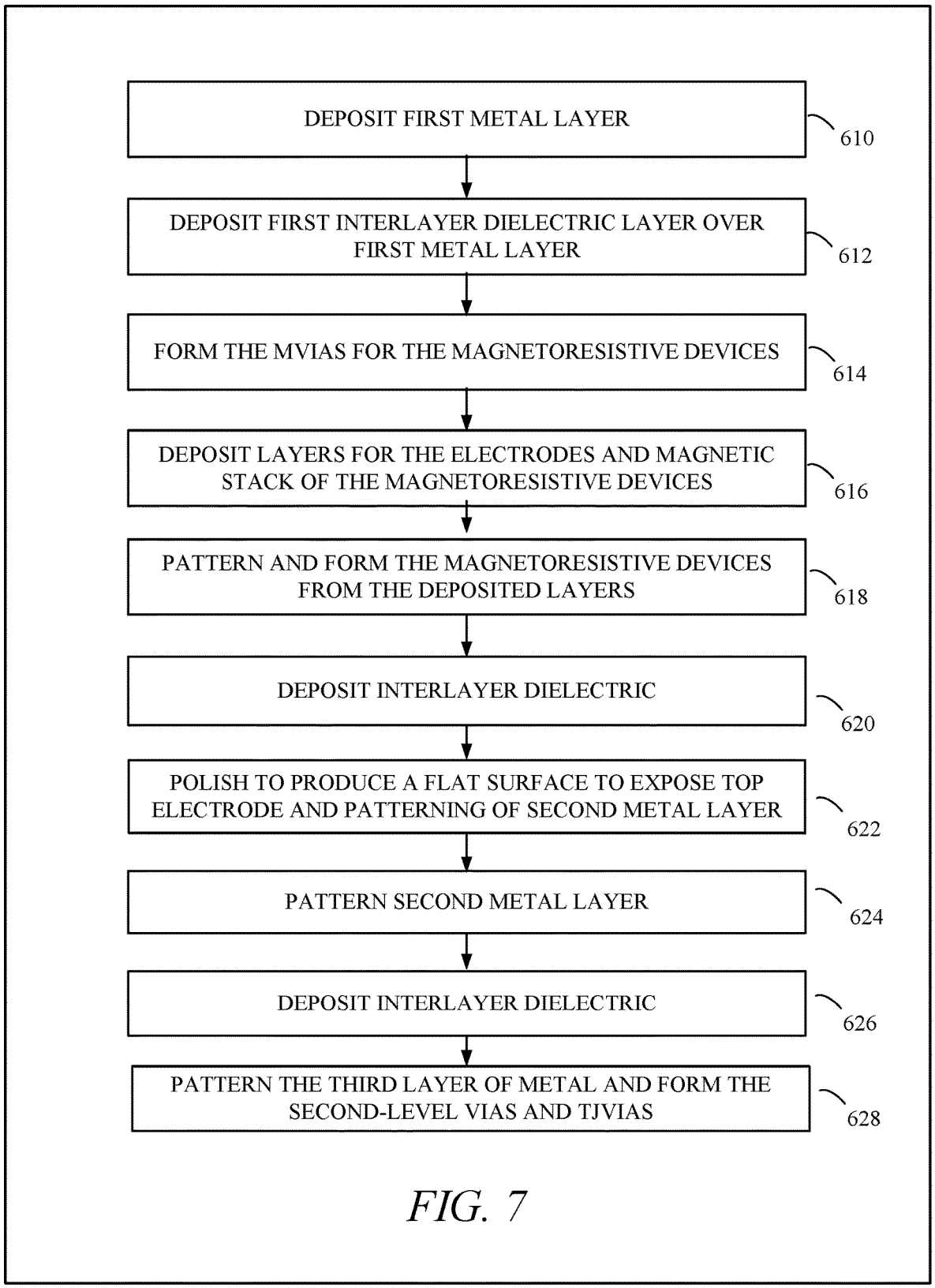
FIG. 7 is a flow chart of a method of manufacturing an integrated circuit that includes magnetoresistive devices in accordance with an exemplary embodiments.

FIG. 7 is a flow chart that illustrates an exemplary embodiment of a method of manufacturing an integrated circuit that includes a plurality of magnetoresistive devices and surrounding circuitry. In one example, the magnetoresistive devices are spin-torque MTJ devices included in MRAM cells. The operations included in the flow chart may represent only a portion of the overall process used to manufacture the device. For illustrative purposes, the following description of the method in FIG. 7 may refer to elements mentioned above in connection with FIGS. 1-6. It should be appreciated that methods may include any number of additional or alternative tasks, the tasks shown in FIG. 7 need not be performed in the illustrated order, and the method may be incorporated into a more comprehensive procedure or process having additional functionality not described in detail herein. Moreover, one or more of the tasks shown in FIG. 7 could be omitted from an embodiment as long as the intended overall functionality remains intact.

The method of manufacturing illustrated in FIG. 7 begins at 610 where a first metal layer is deposited. Prior to the deposition of the first metal layer, other processing steps may have occurred corresponding to circuits and structures underlying the magnetoresistive device portion of the integrated circuit. For example, or other aspects of the magnetoresistive device portion (e.g. select devices corresponding to each magnetoresistive device) may have already been formed. Deposition of the metal layer at 610 includes depositing metal that will be used in both interconnecting magnetoresistive devices as well as in the surrounding logic or other circuitry on the integrated circuit device. In some embodiments, the deposition of the metal layer at 610 may be a single damascene deposition.

At 612 a first interlayer dielectric layer is deposited over the first metal layer. At 614 the Mvias for the magnetoresistive devices are formed in the first interlayer dielectric layer. In some embodiments, forming the Mvias is separate from forming the first level vias in the logic portion of the integrated circuit. An example of such an embodiment was described and discussed above with respect to FIG. 2 in which the Mvia 240 is shorter in height than the first-level via 242. Forming the Mvias may include using a single damascene copper deposition. Note that in other embodiments, such as those illustrated in FIGS. 4 and 5, formation of the Mvias may occur at the same time as the first-level vias are formed in the logic portion of the integrated circuit.

At 616, after formation of the Mvias, the layers for the electrodes and magnetic stack of the magnetoresistive devices are deposited. Thus, the conductive material layer for the bottom electrode, the various magnetic and nonmagnetic layers making up the magnetoresistive stack, and the conductive layer corresponding to the top electrode are all deposited at 616. Any required hard mask can also be deposited at 616. At 618 the magnetoresistive devices are patterned and formed from the layers deposited at 616. While generally described herein as a single deposition and single etch process, formation of the magnetoresistive devices can include multiple deposition, patterning, encapsulation, and etching steps.

At 620 interlayer dielectric material is deposited for the M2/V1 stack, where the interlayer dielectric material fills in the gaps between the magnetoresistive devices formed at 618. The interlayer dielectric deposited at 620 also corresponds to the metal to layer within the magnetoresistive device portion as well as the logic portion of the integrated circuit device. In some embodiments, the interlayer dielectric deposited at 620 is standard low-k dielectric material associated with standard process flows.

At 622, polishing occurs to produce a flat surface for deposition and patterning of the second layer of metal. The polishing performed at 622 may be a chemical mechanical polish (CMP) that also exposes the top electrode of the magnetoresistive devices to allow for electrical contact. At 624, the M2 and V1 layers are patterned. This may be accomplished using a dual-damascene process. Thus, if the first-level vias for the logic portion were not formed at 614, they are formed at 624.

Following patterning of the second metal layer M2, interlayer dielectric for the M3/V2 stack is deposited at 626. The interlayer dielectric material deposited at 626 may be standard low-k dielectric material associated with the standard CMOS process flow. At 628, the M3/V2 layers are patterned. In embodiments such as that illustrated in FIG. 2, this includes forming the TJvias for the magnetoresistive devices using the same process steps as are used to form the second-level vias in the logic portion of the integrated circuit. Patterning the third layer of metal and forming the vias can be done using standard dual damascene methods.

Although the described exemplary embodiments disclosed herein are directed to various integrated circuit devices that include magnetoresistive-based devices and methods for making same, the present disclosure is not necessarily limited to the exemplary embodiments, which illustrate inventive aspects that are applicable to a wide variety of semiconductor processes and/or devices. Thus, the particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions as defined by the appended claims so that those skilled in the art should understand that they can make various changes, substitutions and alterations without departing from the spirit and scope of the inventions in their broadest form.

What is claimed is:

1. An integrated circuit device, comprising:
   a first metal layer;
   a second metal layer;
   a first interlayer dielectric layer between the first metal layer and the second metal layer;
   a first via in contact with the first metal layer and the second metal layer; and
   a magnetoresistive device including:
      a top electrode in contact with a second via;
      a bottom electrode; and
      a magnetoresistive stack between the top electrode and the bottom electrode, wherein the magnetoresistive stack includes a magnetic tunnel junction; and
   wherein the second via is in contact with the second metal layer.

2. The integrated circuit device of claim 1, wherein the first via is disposed in a logic portion and the second via is disposed in a memory portion.

3. The integrated circuit device of claim 1, wherein a sum of a height of the magnetoresistive device and a height of the second via is less than or equal to a height of the first via.

4. The integrated circuit device of claim 1, further comprising an M-via in contact with the bottom electrode and the first metal layer.

5. The integrated circuit device of claim 4, wherein a sum of a height of the M-via, a height of the magnetoresistive device, and a height of the second via, is less than or equal to a height of the first via.

6. The integrated circuit device of claim 5, wherein the M-via is coaxial with the second via.

7. The integrated circuit device of claim 1, wherein a width of the magnetoresistive stack is different than a width of the bottom electrode.

8. An integrated circuit device, comprising:
   a first metal layer;
   a second metal layer;
   an interlayer dielectric layer between the first metal layer and the second metal layer; and
   a magnetoresistive device including:
      a top electrode in contact with a via;
      a bottom electrode; and
      a magnetoresistive stack between the top electrode and the bottom electrode, wherein the magnetoresistive stack includes a magnetic tunnel junction; and
   wherein the via is coupled to the second metal layer.

9. The integrated circuit device of claim 8, further comprising an M-via in contact with the bottom electrode and the first metal layer, wherein the M-via is coaxial with the via.

10. The integrated circuit device of claim 9, wherein the via is a first via, and the integrated circuit device further comprises a second via in contact with the first metal layer and the second metal layer.

11. The integrated circuit device of claim 10, wherein a sum of a height of the first via and a height of the M-via is less than or equal to a height of the second via.

12. The integrated circuit device of claim 8, wherein a width of the magnetoresistive stack is different than a width of the bottom electrode.

13. The integrated circuit device of claim 12, wherein the width of the bottom electrode is greater than the width of the magnetoresistive stack.

14. An integrated circuit device, comprising:
   a first metal layer;
   a second metal layer above the first metal layer;
   a first interlayer dielectric layer under the first metal layer;
   a second interlayer dielectric layer between the first metal layer and the second metal layer; and
   a magnetoresistive device below the second metal layer, wherein the magnetoresistive device includes:
      a top electrode;
      a bottom electrode; and
      a magnetoresistive stack between the top electrode and the bottom electrode, wherein the magnetoresistive stack includes a magnetic tunnel junction.

15. The integrated circuit device of claim 14, wherein the magnetoresistive device has a height less than or equal to a sum of a height of the first metal layer, a height of the first interlayer dielectric layer, and a height of the second interlayer dielectric layer.

16. The integrated circuit device of claim 14, wherein the magnetoresistive device is coupled to the second metal layer with a via.

17. The integrated circuit device of claim 16, wherein the via has a height less than or equal to a height of the second interlayer dielectric layer.

18. The integrated circuit device of claim 14, wherein the magnetoresistive device is between the first metal layer and the second metal layer.

19. The integrated circuit device of claim 14, wherein the bottom electrode is in contact, and coaxial, with an M-via.

20. The integrated circuit device of claim 19, wherein the M-via is coupled to the first metal layer and has a height less than or equal to 0.1 microns.

* * * * *